United States Patent
Davison

(10) Patent No.: US 7,285,447 B2
(45) Date of Patent: Oct. 23, 2007

(54) METHOD AND APPARATUS FOR IMPRINTING A CIRCUIT PATTERN USING ULTRASONIC VIBRATIONS

(75) Inventor: Peter A. Davison, Puyallup, WA (US)

(73) Assignee: Intel Corporation, Santa Clara, CA (US)

( * ) Notice: Subject to any disclaimer, the term of this patent is extended or adjusted under 35 U.S.C. 154(b) by 764 days.

(21) Appl. No.: 10/607,294

(22) Filed: Jun. 25, 2003

(65) Prior Publication Data

US 2004/0266064 A1    Dec. 30, 2004

(51) Int. Cl.
   *H01L 21/00*    (2006.01)
(52) U.S. Cl. ................ 438/120; 438/637; 257/E21.577
(58) Field of Classification Search ................ 438/120
   See application file for complete search history.

(56) References Cited

U.S. PATENT DOCUMENTS

| | | | |
|---|---|---|---|
| 3,670,394 A * | 6/1972 | Daniels et al. ........... 228/110.1 |
| 3,939,033 A | 2/1976 | Grgach et al. |
| 4,144,109 A | 3/1979 | Waligorski |
| 4,224,091 A | 9/1980 | Sager |
| 4,265,842 A | 5/1981 | Summo |
| 4,313,778 A | 2/1982 | Mims |
| 4,411,720 A | 10/1983 | Sager |
| 4,424,433 A | 1/1984 | Inoue |
| 4,555,302 A | 11/1985 | Urbanik |
| 4,560,427 A | 12/1985 | Flood |
| 4,610,750 A | 9/1986 | Mango |
| 4,618,516 A | 10/1986 | Sager |
| 4,690,722 A | 9/1987 | Flood |
| 4,934,103 A | 6/1990 | Campergue et al. |
| 5,140,773 A | 8/1992 | Miwa et al. |
| 5,435,863 A | 7/1995 | Frantz |
| 5,525,172 A | 6/1996 | Cadiou |
| 5,846,377 A | 12/1998 | Frantz et al. |
| 6,004,427 A | 12/1999 | Kohn |
| 6,036,796 A | 3/2000 | Halbert et al. |
| 6,070,777 A | 6/2000 | Patrikios et al. |
| 6,098,684 A | 8/2000 | Terawaki |
| 6,168,063 B1 | 1/2001 | Sato et al. |
| 6,171,415 B1 | 1/2001 | Statnikov |
| 6,241,692 B1 | 6/2001 | Tu et al. |
| 6,244,498 B1 | 6/2001 | Jiang et al. |
| 6,269,999 B1 | 8/2001 | Okazaki et al. |
| 6,290,808 B1 | 9/2001 | McKee et al. |
| 6,338,765 B1 | 1/2002 | Statnikov |
| 6,367,685 B1 | 4/2002 | Jiang et al. |
| 6,454,757 B1 | 9/2002 | Nita et al. |
| 6,458,225 B1 | 10/2002 | Statnikov |
| 2001/0051420 A1 * | 12/2001 | Besser et al. ................ 438/597 |

OTHER PUBLICATIONS

Howell et al., "Selective Rate Enhancement Of Etching Processes By Acoustic Agitation", Dec. 1990, IEEE Ultrasonics Symposium, pp. 861-863.*

* cited by examiner

*Primary Examiner*—Lex Malsawma

(57) ABSTRACT

Embodiments of a method and apparatus for imprinting a trench pattern on a substrate using ultrasonic vibrations. The trench pattern corresponds to a circuit pattern that is to be formed on the substrate, the circuit pattern including a number of conductive traces and other conductive elements. In one embodiment, the substrate includes a base layer and a layer of dielectric material overlying a surface of the base layer, and the circuit pattern is formed in the dielectric layer.

50 Claims, 15 Drawing Sheets

METHOD AND APPARATUS FOR IMPRINTING A CIRCUIT PATTERN USING ULTRASONIC VIBRATIONS

FIELD OF THE INVENTION

The invention relates generally to integrated circuit device packaging and, in particular, to a method of forming circuitry on a substrate.

BACKGROUND OF THE INVENTION

To package an integrated circuit (IC) chip, such as a processing device or a memory device, the IC die is typically mounted on a substrate, this substrate often referred to as the "package substrate." The package substrate may comprise multiple layers—e.g., a base or "core" layer constructed from an insulating material having one or more layers of a dielectric material disposed thereon—and each layer may include circuitry. The circuitry on a given layer may include a number of conductive traces or other conductive elements arranged in a desired pattern. This circuitry on the package substrate is electrically coupled with the leads of a die mounted thereon. For a flip-chip package—employing, for example, Controlled Collapse Chip Connection (or "C4") assembly techniques—an array of bond pads on the die are coupled to a corresponding array of leads, or "lands", on the package substrate by an array of connection elements (e.g., solder balls, columns, etc.). Alternatively, the die bond pads may be connected to leads on the package substrate using wire bonding or another suitable process.

The circuitry provided by the package substrate routes the IC chip leads to locations on the package substrate where electrical connections can be established with a next-level component (e.g., a motherboard, a computer system, a circuit board, another IC device, etc.). For example, the substrate circuitry may route all signal lines to a ball-grid array—or, alternatively, a pin-grid array—formed on a lower surface of the package substrate. The ball- or pin-grid array then electrically couples the packaged IC die to the next-level component, which includes a mating array of terminals (e.g., lands, pin sockets, etc.). Alternatively, the circuitry may route the signal lines to locations proximate the periphery of the package substrate, wherein wirebonding may be used to couple the packaged IC chip to the next-level component.

The circuitry formed on the package substrate comprises a number of electrically conductive elements (e.g., traces, leads, lands, vias, etc.) arranged in a desired pattern. A conductive element, such as trace, typically comprises a trench or other depression formed in a dielectric material that has been filled with an electrically conductive material (e.g., copper or a copper alloy). For multi-layer substrates, a trace on one layer may be electrically coupled to another trace on an adjacent layer (e.g., an underlying or an overlying layer), such as may be accomplished by a conductive via or other suitable structure. The circuitry on any single layer may include tens or even hundreds of individual closely spaced traces and other conductive elements, each trace having a width (and depth) on the order of 30 microns (μm) or less. Distances separating the traces and other conductive elements may also be on the order of several microns (e.g., 10 to 50 μm).

With feature sizes of 30 μm or less, and with electronics manufacturers continually striving to increase circuit density and decrease feature sizes, fabricating package substrates and circuitry for IC device packaging presents numerous design and manufacturing challenges. Typically, to create a desired circuit pattern on the surface of a substrate (or a layer thereof), a series of trenches or other depressions are imprinted on the surface, the trenches corresponding to the desired circuit pattern. The trenches are then filled with a conductive material to create the circuitry. Because of the small feature sizes and separation distances exhibited by the circuit pattern, as noted above, imprinting or otherwise forming the trench pattern in a surface of the substrate (or a layer thereof) is one of the most challenging facets of substrate fabrication.

A number of methods and/or systems have been used to create the trench pattern (or patterns) on a package substrate, including compression molding, cold forming, injection molding, casting, and photolithography. Compression molding uses high pressure and elevated heat to imprint a trench pattern into a surface. However, due to thermal expansion of the tooling under high temperature, compression molding may not be suitable for circuit patterns exhibiting small features sizes and/or separation distances. Cold forming (or "coining") utilizes high pressure at room temperature to imprint the desired pattern of trenches in a surface. The high pressure present during this process—as well as in compression molding—can, however, lead to a number of problems, including substrate damage (e.g., damage to a previously formed layer in a multi-layer structure) and damage to the tooling. Injection molding, which may not suffer from the potentially ill effects of high temperature and/or pressure, is generally suitable for larger substrates, but is less suitable for small substrates having relatively smaller feature sizes. Casting is often too slow for production level manufacturing due to long cure times, and photolithography may not achieve sufficient resolution.

On another front, ultrasonic welding of plastics, as well as metals, is well known. In a typical ultrasonic welding application, two parts (e.g., plastic parts) are joined together by imparting high frequency (e.g., 15 kHz to 40 kHz) mechanical vibrations to the parts at a location of the desired joint. This mechanical energy is transmitted to the parts at the joint area, where this energy is converted to heat through friction. This heat melts the material of each part in a region surrounding the joint, and when vibration is halted, the melted material solidifies to join the two parts.

DETAILED DESCRIPTION OF THE INVENTION

Disclosed are embodiments of a method and apparatus for forming a circuit pattern in a package substrate using ultrasonic mechanical vibrations. To form the circuit pattern, an ultrasonic tool is used to imprint a trench pattern in a layer of the substrate—the trench pattern corresponding to the desired circuit pattern—and a conductive material may then be deposited in the trench pattern to form the circuitry. The disclosed embodiments are described below in the context of fabricating package substrates for IC device packaging. However, it should be understood that the embodiments described herein are not so limited in application and, further, that these embodiments may find application to many other devices exhibiting densely spaced circuitry or otherwise having relatively small structural features.

Figure 1A:
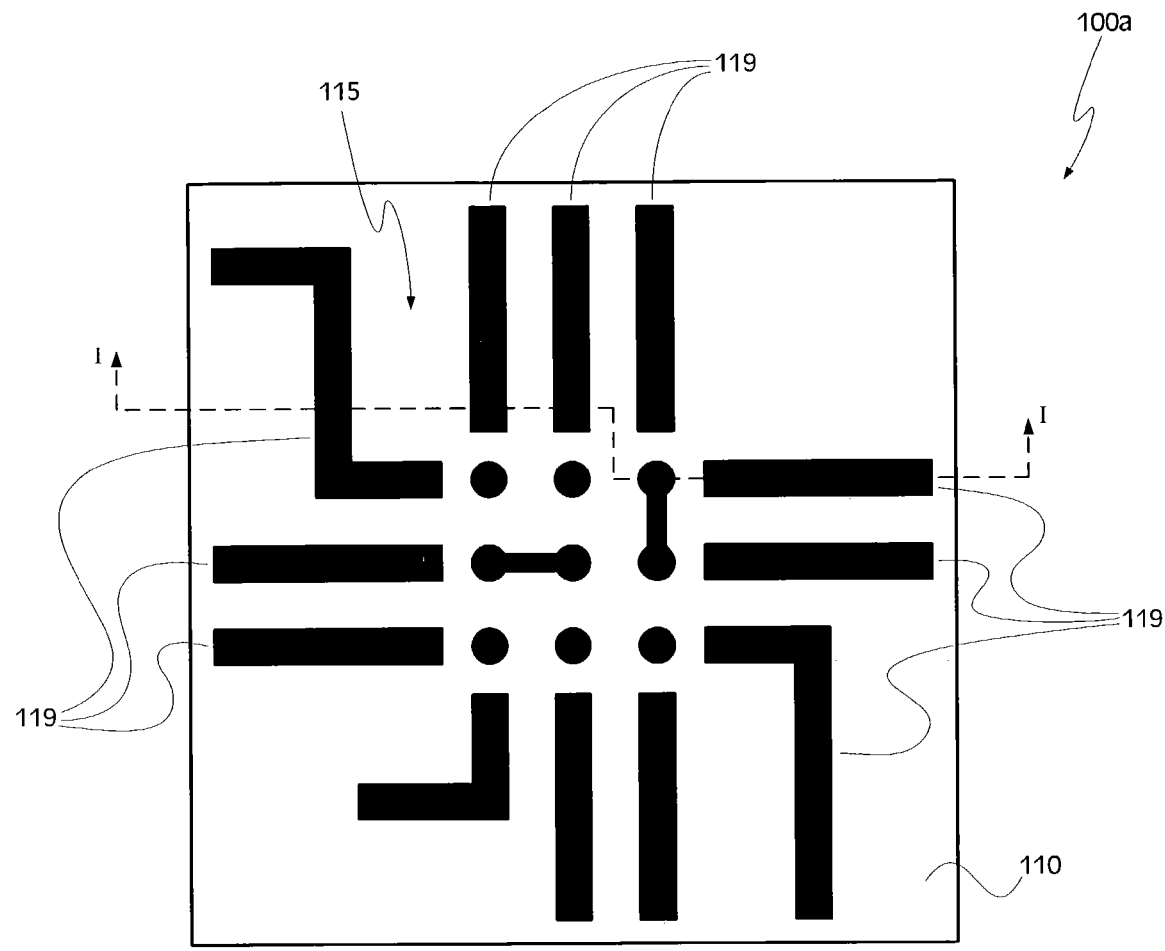
FIG. 1A shows a plan view and a cross-sectional view of one embodiment of a substrate including circuitry formed using ultrasonic vibrations.
Figure 1A:
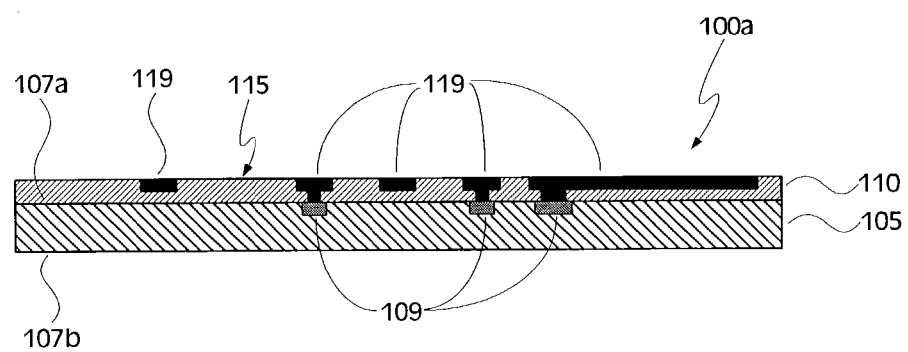
Figure 1B:
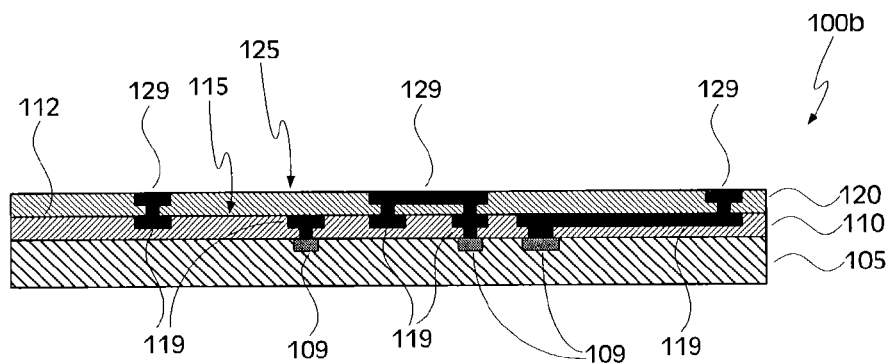
FIG. 1B shows a cross-sectional view of another embodiment of a substrate including circuitry formed using ultrasonic vibrations.
Figure 1C:
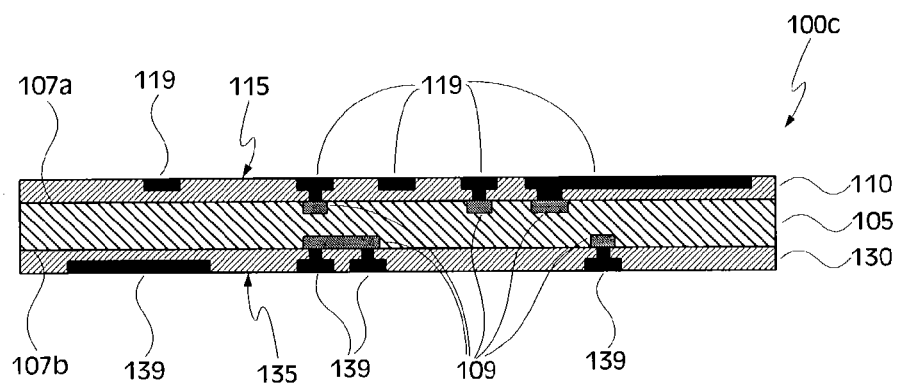
FIG. 1C shows a cross-sectional view of a further embodiment of a substrate including circuitry formed using ultrasonic vibrations.
Figure 1D:
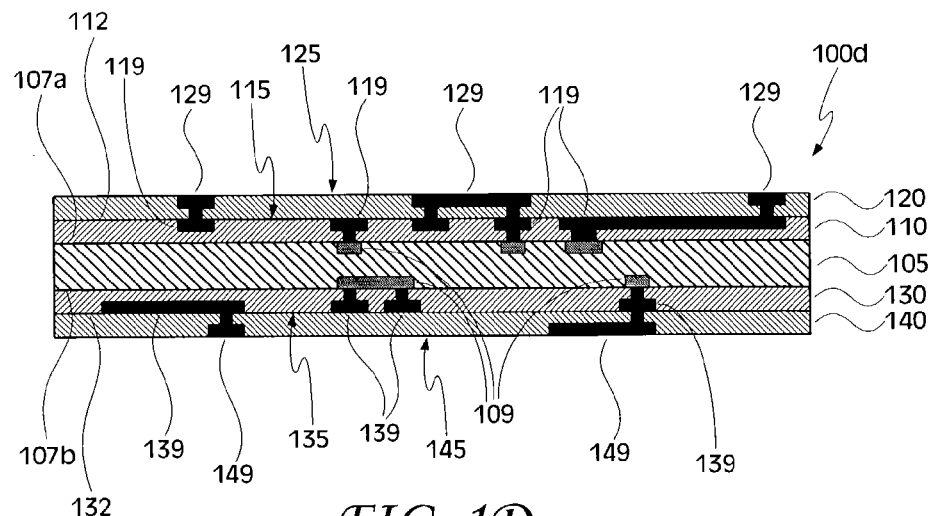
FIG. 1D shows a cross-sectional view of yet another embodiment of a substrate including circuitry formed using ultrasonic vibrations.

Illustrated in FIGS. 1A through 1D are embodiments of a substrate (e.g., a package substrate) created using ultrasonic energy. A plan view and a side elevation view of one embodiment are shown in FIG. 1A. Another embodiment of the substrate is shown in side elevation view in FIG. 1B. A side elevation view of a further embodiment of the substrate is illustrated in FIG. 1C, whereas a side elevation view of yet another embodiment of the substrate is shown in FIG. 1D.

Referring to FIG. 1A, a substrate 100a includes a base layer (or core) 105 having opposing surfaces 107a, 107b. The base layer 105 may comprise any suitable material, such as, for example, a circuit board material (e.g., FR-4), a ceramic material, a semiconductor material, or a polymer (e.g., plastics, epoxies, resins, etc.). A number of conductive elements 109 (e.g., traces) may be disposed in the base layer 105. Construction of such a core 105 is well known in the art.

Disposed on and overlying at least a portion of the surface 107a of base layer 105 is a first layer 110. The first layer 110 is constructed of a dielectric material or other suitable material that will provide electrical isolation between conductive traces and other conductive elements that are formed in the first layer 110 (or other layer). The dielectric material is also amenable to forming using ultrasonic vibrations, as described below. In one embodiment, the dielectric material comprises a thermoplastic material—either amorphous or crystalline—such as for example, polyetherimide (PEI) or polyetheretherkeytone(PEEK). Alternatively, in another embodiment, the dielectric material may comprise a thermosetting material (e.g., an epoxy). For thermosetting materials, the first layer 110 (as well as layers 120, 130, and 140) may comprise a preformed sheet that is attached to the base layer 105 using a lamination process, wherein the first layer 110 is compressed against the base layer 105 at a pressure, and under a temperature, that causes the thermosetting material to adhere to the base layer. For thermoplastic materials, the first layer 110 (as well as layers 120, 130, 140) may comprise a preformed sheet that is attached to the base layer 105 using an adhesive, or that is attached to base layer 105 using a thermobonding process, wherein the first layer 110 is heated to a temperature at which the thermoplastic material begins to melt and bond with the base layer.

Figure 2:
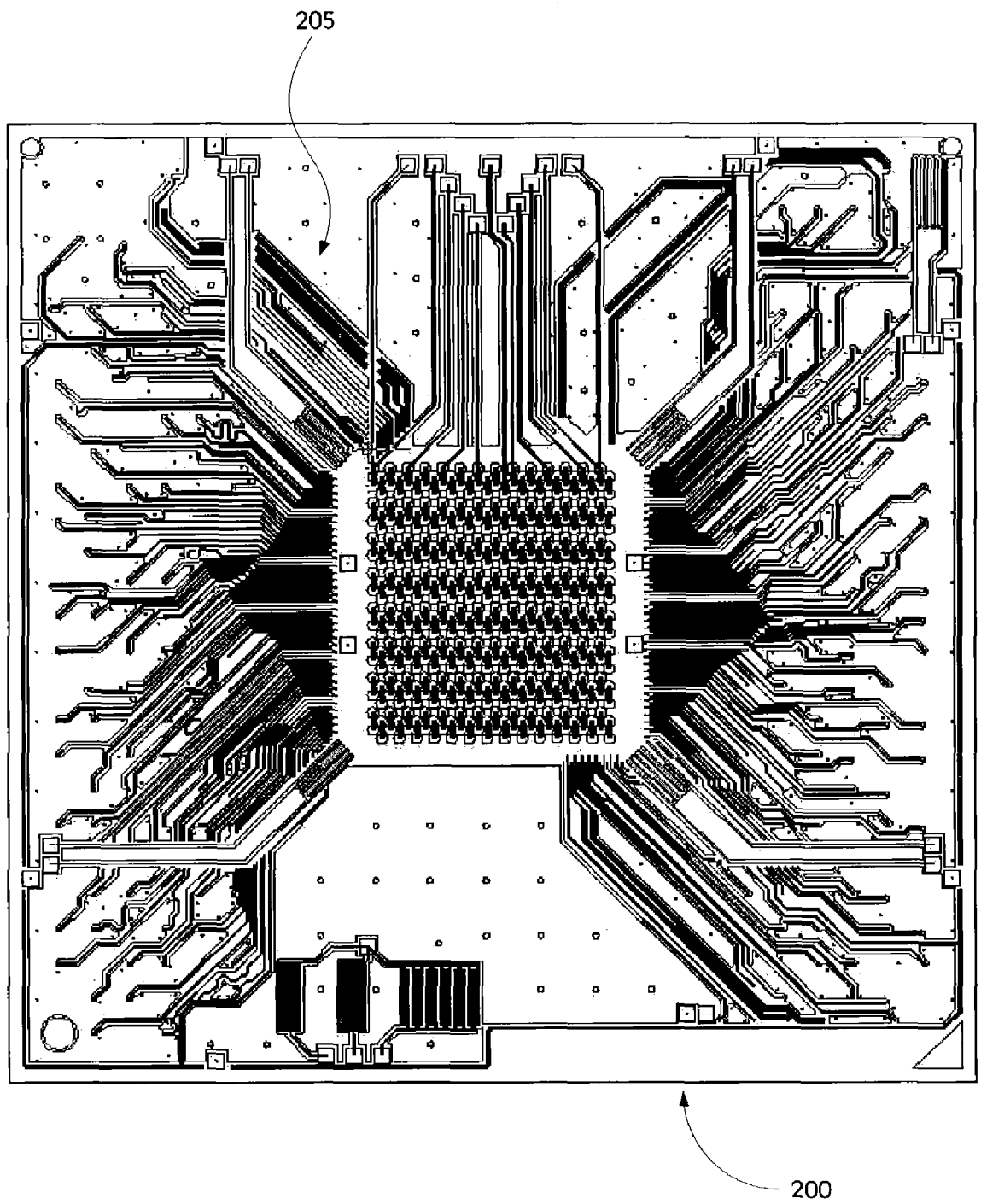
FIG. 2 shows a plan view of an embodiment of a substrate and circuit pattern that may be formed using ultrasonic vibrations.

Formed in the first layer 110 is a circuit pattern 115. The circuit pattern 115 includes a number of traces and/or other conductive elements 119. Some of the conductive elements 119 in the first layer 110 may each be electrically coupled with a corresponding conductive element 109 in the base layer 105, as shown in the cross-sectional view of FIG. 1A. The conductive elements 119 may comprise Copper (Cu), or an alloy thereof, as well as any other suitable conductive material The circuit pattern 115 formed in first layer 110 is illustrated in plan view in FIG. 1A. This circuit pattern 115 is a simplified pattern intended for use in illustrating the disclosed embodiments. It should be understood, however, that the circuit pattern 115 shown in FIG. 1A is provided for ease of illustration and, further, that such a circuit pattern may—and, in practice, likely will—be much more complex, including hundreds of closely-spaced conductive traces (and other conductive elements) having dimensions on the order of several microns. An example of such a circuit pattern 205 formed on a substrate 200 is illustrated in FIG. 2. The circuit pattern 205 of FIG. 2 is but one example of circuitry that may be fabricated according to the disclosed embodiments.

Referring to FIG. 1B, another embodiment of the substrate is shown. The substrate 100b of FIG. 1B is similar to the substrate 100a of FIG. 1A. However, the substrate 100b further includes a second layer 120 disposed on and overlying at least a portion of a surface 112 of first layer 110. The second layer 120 is also constructed of a dielectric material (or other suitable material) that provides the needed electrical isolation and that is amenable to forming using ultrasonic energy (although not necessarily the same material as the first layer 110), such as a thermoplastic or thermosetting material, as described above. Formed in the second layer 120 is a circuit pattern 125 comprised of a number of traces and/or other conductive elements 129. Some of the conductive elements 129 in the second layer 120 may each be electrically coupled with a corresponding conductive element 119 in first layer 110, as illustrated in FIG. 1B.

With reference to FIG. 1C, illustrated is a further embodiment of the substrate. The substrate 110c of FIG. 1C is similar to the substrate 100a of FIG. 1A; however, the substrate 100c further includes another layer 130 disposed on and overlying at least a portion of the opposing surface 107b of base layer 110. The additional layer 130 is also constructed of a dielectric material (or other suitable material) that provides the needed electrical isolation and that is amenable to forming using ultrasonic energy (although not necessarily the same material as the first layer 110), including thermoplastic and thermosetting materials, as previously described. Formed in the additional layer 130 is a circuit pattern 135 comprised of a number of traces and/or other conductive elements 139, and some of the conductive elements 139 in this layer 130 may each be electrically coupled with a corresponding conductive element 109 in base layer 105, as shown in FIG. 1C.

Referring now to FIG. 1D, yet another embodiment of the substrate is shown. The substrate 100d of FIG. 1D is similar to the substrate 100b of FIG. 1B (and the substrate 100c of FIG. 1C). However, the substrate 100d further includes a third layer 130 disposed on and overlying at least a portion of the opposing surface 107b of the base layer 105 (see FIG. 1C), as well as a fourth layer 140 disposed on and overlying at least a portion of a surface 132 of the third layer 130. Each of the third and fourth layers 130, 140 is likewise constructed of a dielectric material (or other suitable material) that provides the needed electrical isolation and that is amenable to forming via ultrasonic energy, such as the above-mentioned thermoplastic and thermosetting materials. The first, second, third, and fourth layers 110-140 may be constructed of the same material or, alternatively, different materials. Formed in the third layer 130 is a circuit pattern 135 comprised of a number of traces and/or other conductive elements 139. Some of the conductive elements 139 in the third layer 130 may each be electrically coupled with a corresponding conductive element 109 in base layer 105. Similarly, formed in the fourth layer 140 is a circuit pattern 145 comprised of a number of traces and/or other conductive elements 149, wherein some of the conductive elements 149 in fourth layer 140 may each be electrically coupled with a corresponding conductive element 139 in third layer 130.

Figure 3:
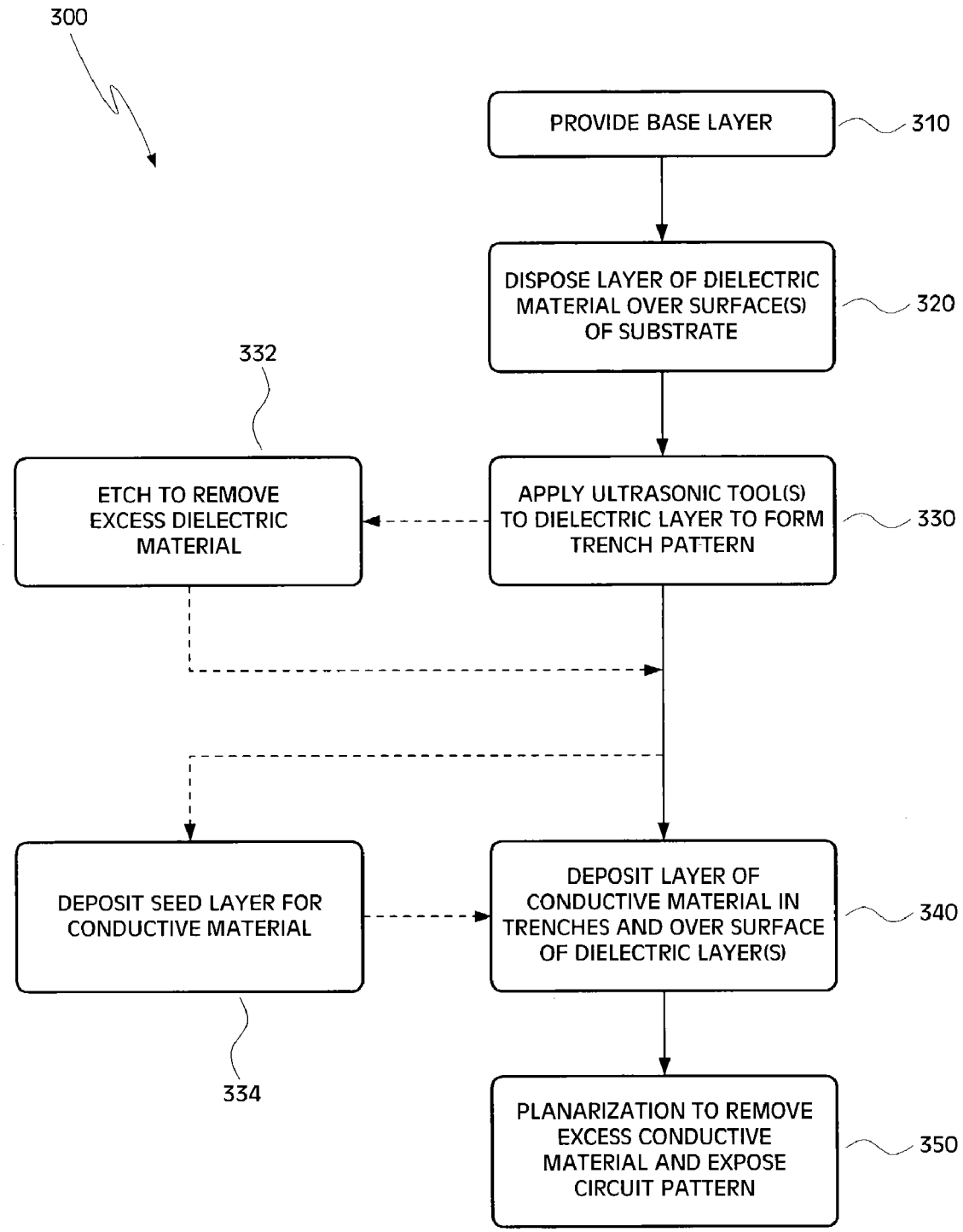
FIG. 3 is a block diagram illustrating an embodiment of a method of forming circuitry using ultrasonic vibrations.

Turning now to FIG. 3, illustrated are embodiments of a method 300 of forming a circuit pattern using ultrasonic mechanical vibrations, which methods may be utilized to fabricate the embodiments of the substrate 100a-d shown in FIGS. 1A-1D. The methods of FIG. 3 are further illustrated in FIGS. 4A through 4G, which illustrate one embodiment of the method 300 of forming a circuit pattern, FIGS. 4H through 4M, which illustrate another embodiment of the method 300 of forming a circuit pattern, and FIGS. 4N through 4Q, which illustrate a further embodiment of this method. In the following discussion of the method 300 of forming a circuit pattern using ultrasonic mechanical energy, as shown in FIG. 3, reference should be made to the figures of FIGS. 4A-4Q, as called out in the text.

Figure 4A:
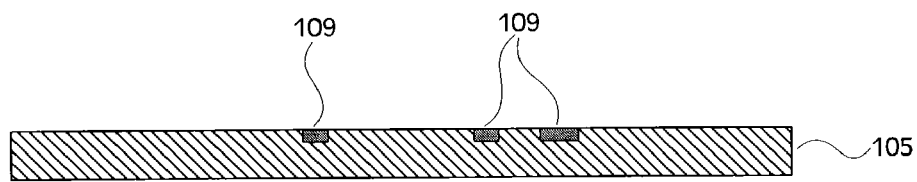
FIGS. 4A-4G illustrate a substrate and circuitry that may be formed according to one embodiment of the method of forming circuitry of FIG. 3.
Figure 4B:
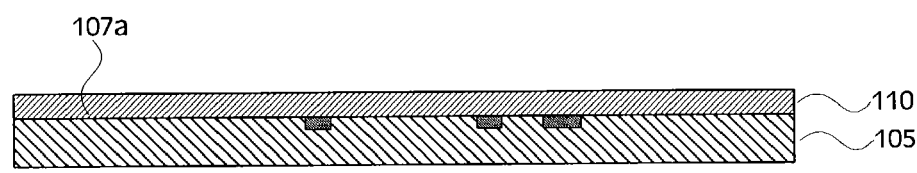

Referring to block 310 in FIG. 3 and FIG. 4A, a base layer (or core) 105 is provided, and this base may include one or more conductive elements 109. A layer of dielectric material is then disposed over at least a portion of one or more surfaces of the base layer, as shown at block 320. This is illustrated in FIG. 4B, where a first layer of dielectric material 110 has been disposed over the surface 107a of the base layer 105. Again, for thermosetting materials, the first layer 110 may be secured to the base layer 105 using a lamination process, and for thermoplastic materials, the first layer 105 may be secured to the base layer 105 using an adhesive or a thermobonding process, all as described above.

Figure 4C:
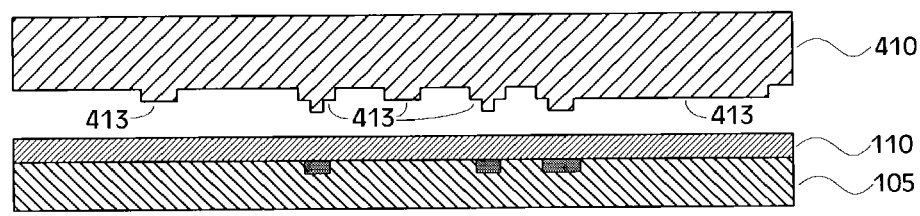
Figure 4D:
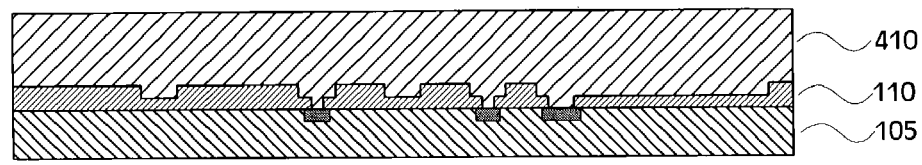
Figure 4E:
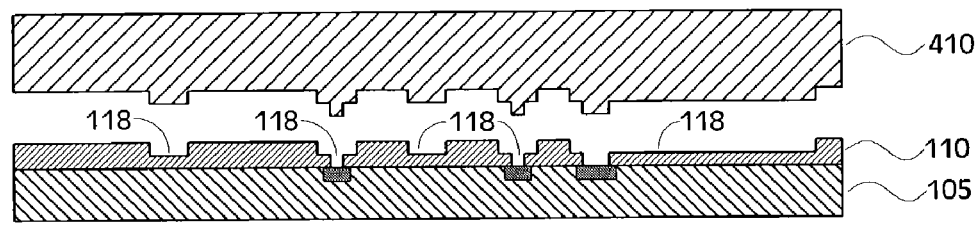

An ultrasonic tool (or tools) is then applied to the dielectric layer (or layers) to form a desired trench pattern, which is shown at block 330. Referring to FIGS. 4C through 4E, an ultrasonic tool 410 includes a number of raised features or protrusions 413 disposed on its face, wherein these raised features comprise a trench pattern that is to be formed in the dielectric layer 110. The ultrasonic tool 410 is brought into contact with the dielectric layer 110, and the ultrasonic tool is plunged into the dielectric layer to the desired depth (see FIG. 4D). When the ultrasonic tool is retracted from the dielectric layer, as shown in FIG. 4E, a number of trenches 118 are formed at locations corresponding to the raised features 413 on the ultrasonic tool. The trenches 118 form a trench pattern that corresponds with the desired circuit pattern that will ultimately be formed in dielectric layer 110.

Figure 5:
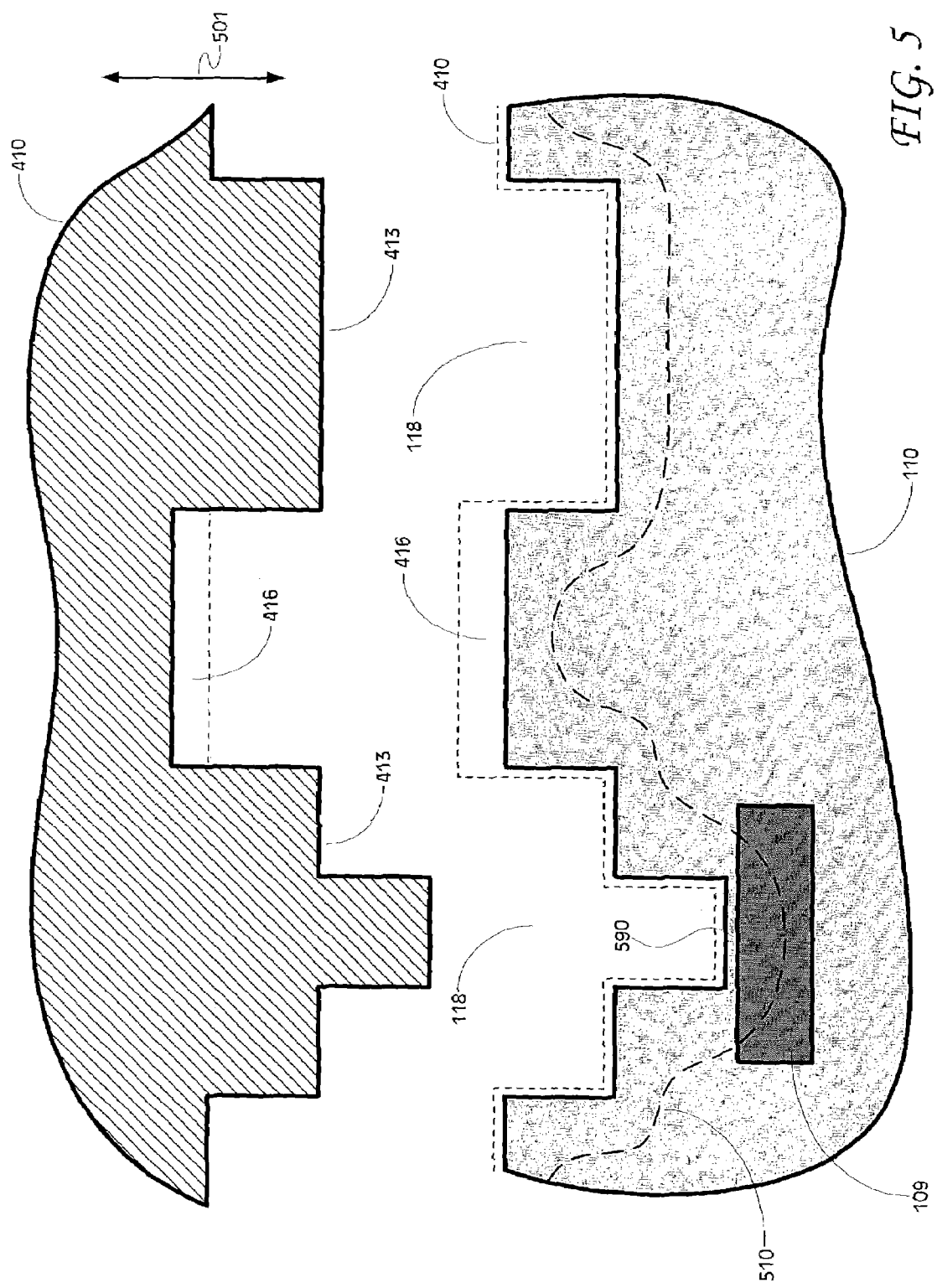
FIG. 5 shows an enlarged, partial cross-sectional view of one embodiment of a substrate and an ultrasonic tool.

The manner in which the ultrasonic tool imprints the trench pattern into the dielectric layer 110 is further illustrated in FIG. 5. Referring to FIG. 5, the ultrasonic tool 410 vibrates vertically (see arrow 501) at a frequency in the ultrasonic range. In one embodiment, this frequency is in a range of 15 kHz to 40 kHz. In other embodiments, however, this frequency may be less than 15 kHz (e.g., down to 10 kHz) or greater than 40 kHz (e.g., up to 70 kHz). During trench formation, the workpiece (e.g., base layer 110 and other layers disposed thereon) is generally held rigid, such that the mechanical energy of the ultrasonic tool 410 can be imparted to the workpiece. However, in another embodiment, the workpiece itself may be ultrasonically vibrated while the tool 410 is held rigid.

The energy associated with the ultrasonic vibrations is transferred (in the form of friction) to the dielectric layer 10, causing the dielectric material's temperature to rise at locations proximate the face of ultrasonic tool 410. This is illustrated in FIG. 5, which shows a thermal region 510 forming near the face of tool 410. Due to the energy received from the ultrasonic tool 410, the thermal region 510 has an elevated temperature relative to other portions of the dielectric layer. Note that the thermal region 510 is not static. Rather, as the ultrasonic tool 410 and protrusions 413 are plunged into the dielectric layer 110, a thermal wave propagates outwardly within the dielectric material from ultrasonic tool 410. The thermal wave forming in the dielectric layer 110 causes the dielectric material to melt, thereby allowing the dielectric material proximate tool 410 to flow and form into a shape that is nearly identical (or at least substantially similar) to that of the raised features 413.

Figure 6:
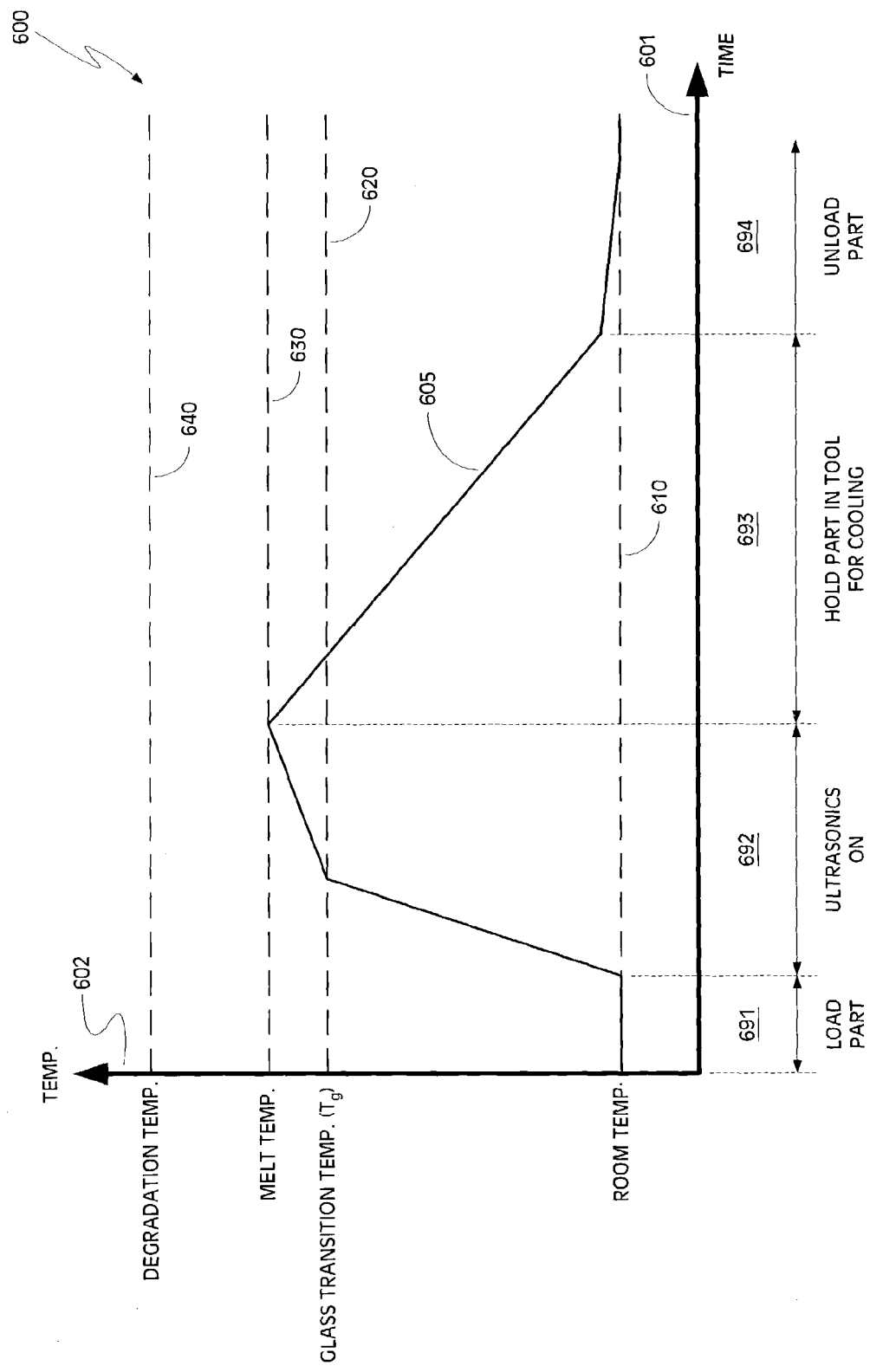
FIG. 6 is a temperature vs. time graph illustrating one embodiment of the thermal characteristics present during the method of forming circuitry of FIG. 3.

The thermal characteristics of the dielectric material during ultrasonic forming are, for one embodiment, illustrated in FIG. 6. Referring to this figure, a graph 600 depicts the temperature 602 of the dielectric material (in a region near the face of tool 410) as a function of time 601, and a curve 605 of temperature vs. time for this embodiment is shown.

During an initial period 691, where the part (e.g., a base layer for a single substrate or a larger board upon which multiple substrates will be fabricated) may be loaded, the dielectric material is at ambient temperature 610. At some time, the ultrasonic tool 410 is powered on and plunged into the dielectric layer 110, and the ultrasonic tool is engaged with the dielectric layer for a second period of time 692. During this time period 692, the temperature of the dielectric material in a region surrounding the ultrasonic tool 410 (i.e., thermal region 510 shown in FIG. 5) is raised first to a glass transition temperature ($T_g$) 620, where the dielectric material will begin to flow. During this period 692, the temperature may reach a melt temperature 630, where the dielectric material can readily flow and form to the raised features 413 of the tool. As the dielectric material begins to soften, its ability to absorb additional thermal energy decreases, which helps to prevent the temperature of the dielectric material from achieving a degradation temperature 640, at which point the dielectric material may become irreversibly damaged. Also, because the ability of the dielectric material to absorb thermal energy decreases as it begins to melt, a wide processing window (i.e., period 692) is provided during which melting and trench formation may take place without approaching a degradation temperature 640 of the dielectric material.

At some later time, the ultrasonic tool's power is shut off, and the ultrasonic tool is held in an engagement position with the part for cooling. During this cooling period 693, the dielectric material will cool down below the glass transition temperature 620 and approach the ambient temperature 610. Because the ultrasonic tool and part are held together, the dielectric material will form in the shape of the raised features 413 on the ultrasonic tool 410, as noted above. During a subsequent period of time 694, the part is unloaded and will continue to cool.

Referring back to FIG. 5, the ultrasonic tool 410 may include overflow regions, or "flash traps," 416. When the ultrasonic tool 410 is plunged into the dielectric layer 110, some of the dielectric material may be displaced by the trench forming process. The overflow regions 416 accommodate this displaced volume of dielectric material by providing a space into which the displaced material can flow. In one embodiment, as shown in FIG. 5, a flash trap 416 comprises a region of increased depth between raised features 413, and this region provides additional volume into which displaced material can flow. Note that the displaced material may remain on the upper surface of the dielectric layer 110; however, this material can be removed in a subsequent planarization process, as will be described below.

Figure 4F:
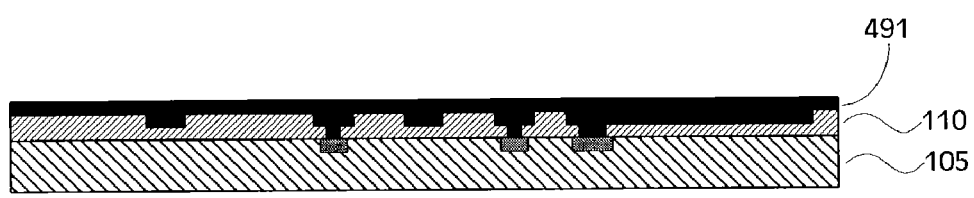

Returning now to FIG. 3, a layer of conductive material is deposited over at least a portion of the upper surface of the dielectric layer 110 and within the trenches 118, as shown at block 340. This is illustrated in FIG. 4F, which shows a layer of conductive material 491 disposed over the dielectric layer 110. The conductive layer 491 may comprise any suitable conductive material, including copper or an alloy of copper, and this layer 491 may be deposited using any suitable process, including chemical vapor deposition (CVD), sputtering, electroless plating, or other deposition process.

Figure 4G:
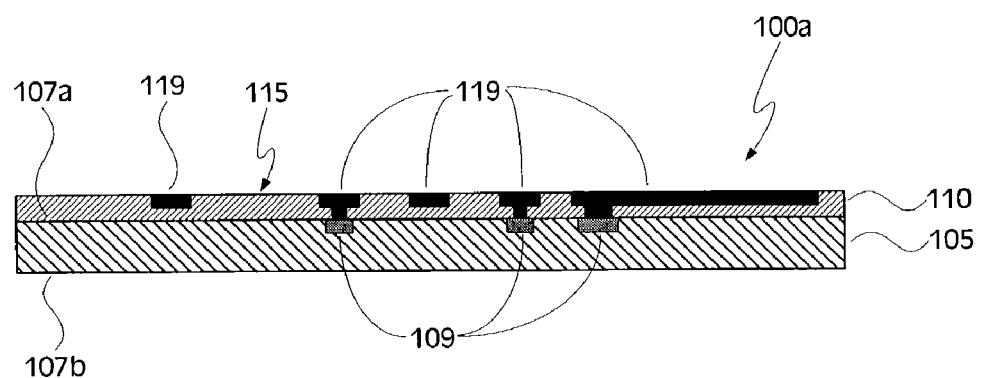

Referring to block 350, a planarization process is performed to remove the excess conductive material from the dielectric layer 110, thereby exposing the circuit pattern formed in the dielectric layer. Generally, in addition to filling the trenches formed in the dielectric layer, the conductive material will be deposited over the upper surface of the dielectric layer as well. Any suitable planarization process (or other material removal process) may be utilized to remove the excess conductive material from the upper surface of the dielectric layer, such as, for example, a chemical mechanical polishing (CMP) process. In another embodiment, an etching process is employed to remove the excess conductive material. This is illustrated in FIG. 4G, wherein the conductive layer 491 has been substantially removed to expose the conductive elements 119, each conductive element 119 comprising a trench 118 that has been filled with the conductive material. The structure shown in FIG. 4G is the same as the embodiment of the substrate 100*a* shown in FIG. 1A.

In an alternative embodiment, after trench formation using the ultrasonic tool is complete (see block 330), an etching process (e.g., a plasma etch) is performed to remove excess dielectric material, as shown at block 332. After trench formation, excess dielectric material may remain in the bottom of a trench. This is illustrated in FIG. 5, where excess dielectric material 590 remains at the bottom of one of the trenches 118, this excess material referred to as a "chad." Once the conductive material is laid down in the trenches 118 these chads 590 can inhibit electrical contact between the conductive material and the conductive elements 109 in base layer 105 (or conductors in an underlying dielectric layer). Thus, etching may be desirable to insure that adequate electrical contact is formed between the conductive elements 119 in dielectric layer 110 and the conductive elements 109 in base layer 105.

In another alternative embodiment, prior to deposition of the conductive layer 491 over the dielectric layer 110 and trenches 118, a seed layer for the conductive material is deposited over the dielectric layer 110, as shown at block 334. The seed layer (not shown in figures) can assist deposition and growth of the conductive material layer 491 on the dielectric layer. Any suitable process, such as CVD, may be used to deposit the seed layer of conductive material.

Referring back to FIG. 4G, thus far only a single dielectric layer 110 including circuitry 115 has been formed on the base layer 105. However, employing the method 300 of forming circuitry using ultrasonic vibrations, any suitable number of layers and circuitry may be disposed on the base layer 105, on either one of or both of the opposing sides 107*a*, 107*b* thereof. The addition of other layers and circuitry is illustrated in FIGS. 4H through 4M and in FIGS. 4N through 4Q.

Figure 4H:
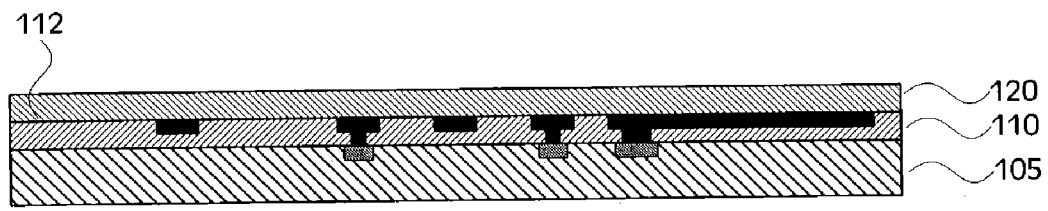
FIGS. 4H-4M illustrate a substrate and circuitry that may be formed according to another embodiment of the method of forming circuitry of FIG. 3.
Figure 4I:
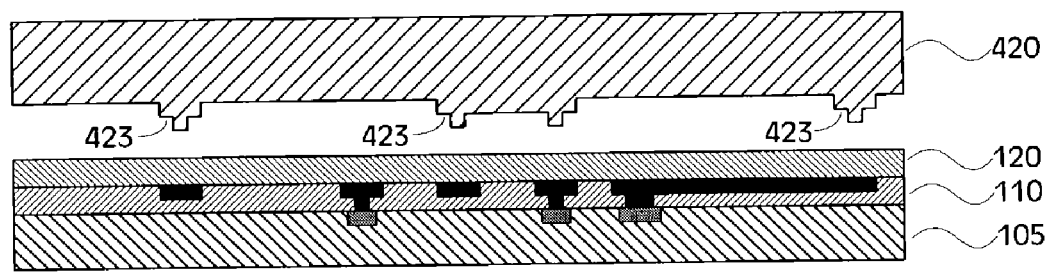
Figure 4J:
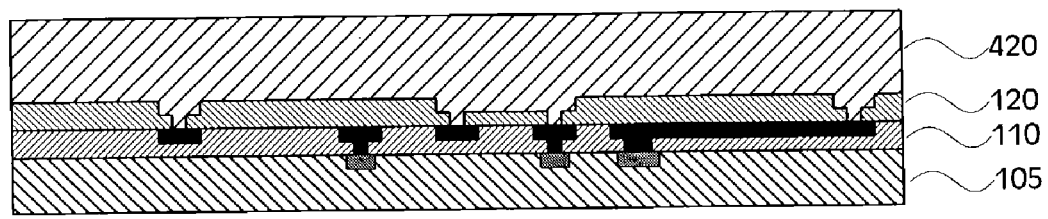
Figure 4K:
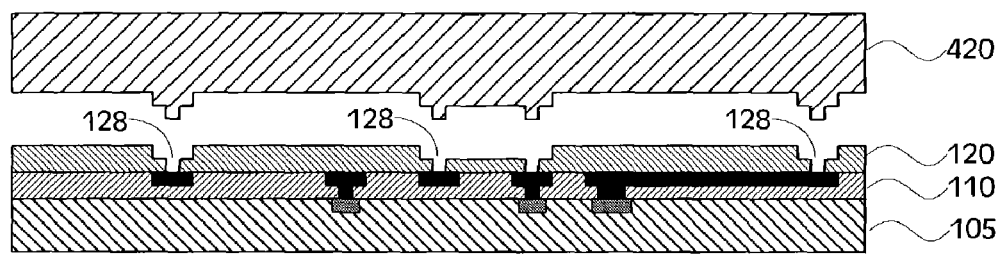

With reference now to FIG. 4H, a second layer 120 of dielectric material is disposed over at least a portion of a surface 112 of the first layer of dielectric material 110 (see block 320). Note that the underlying structure in FIG. 4H—i.e., the base layer 105 and first dielectric layer 110 having circuitry 115—is the structure of FIG. 4G. Referring to FIGS. 4I through 4K, a second ultrasonic tool 420 includes a number of raised features 423 that correspond to the desired circuit pattern to be formed in the second dielectric layer 120. The ultrasonic tool 420 is plunged into the dielectric layer to the desired depth, as shown in FIG. 4J (see block 330). When the ultrasonic tool is retracted from the second dielectric layer 120, as shown in FIG. 4K, a number of trenches 128 are formed at locations corresponding to the raised features 423 on the ultrasonic tool 420.

Figure 9:
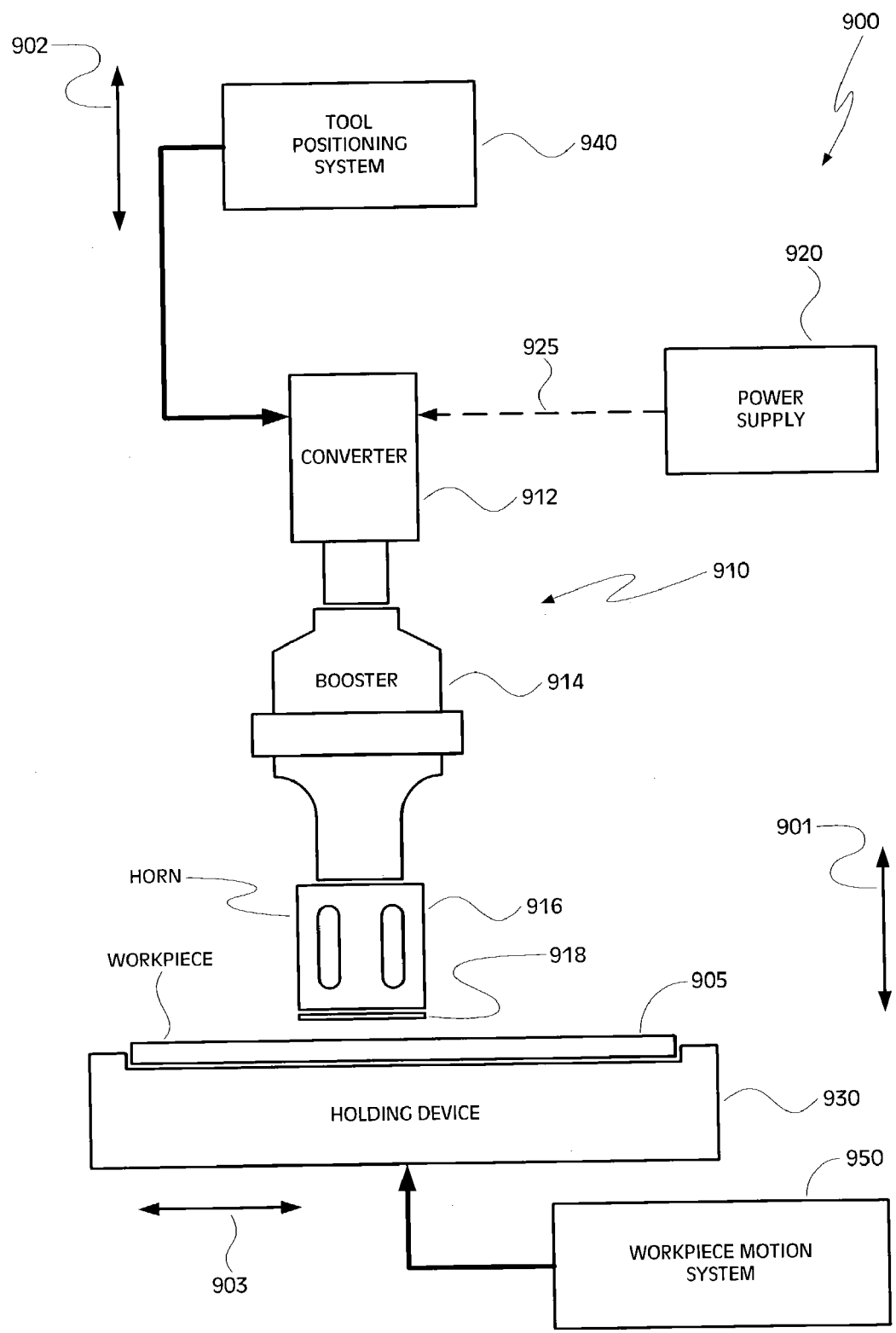
FIG. 9 is a schematic diagram illustrating an embodiment of an ultrasonic apparatus which may be used to form circuitry according to the disclosed embodiments.

It is noted here that each of the ultrasonic tools 410, 420 (and the tool 430 of FIGS. 4N-4Q) is intended to represent a plate or other structure upon which the raised features have been formed. Such a plate having a pattern of raised features that mirrors the desired trench pattern is also referred to as a "tool foil." The tool foil is then mechanically coupled with a source of ultrasonic mechanical vibrations. An embodiment of an apparatus providing ultrasonic vibrations is illustrated in FIG. 9. Generally, each layer in a multi-layer substrate will have a unique circuit pattern, and each of the ultrasonic tools 410, 420 will, therefore, have a distinct pattern of raised features. However, it should be understood that, while separate ultrasonic tool foils 410, 420 may be used to create circuitry in the dielectric layers 110, 120, respectively, the same apparatus for producing the ultrasonic vibrations may be used.

Figure 4L:
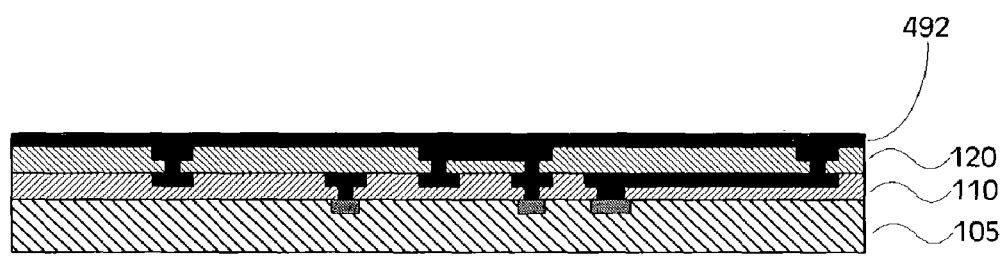
Figure 4M:
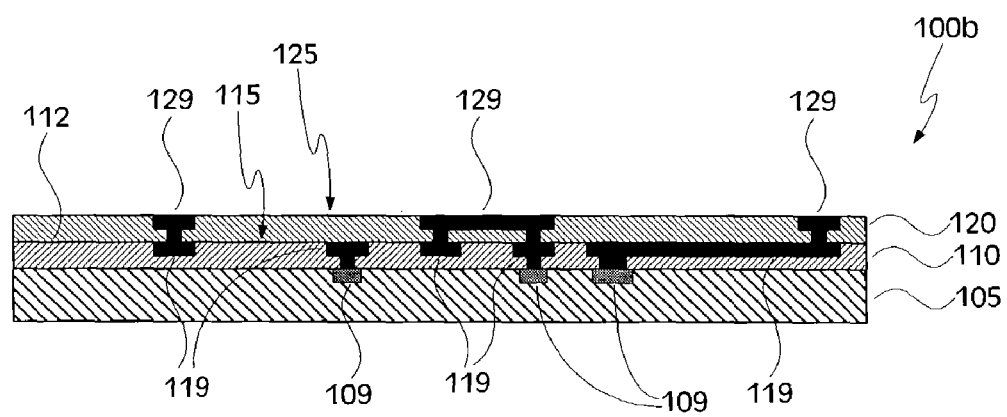

Returning to the figures, and FIG. 4L in particular, a second layer of conductive material 492 is formed over at least a portion of the upper surface of second dielectric layer 120 and within the trenches 128 formed in this layer (see block 340). Prior to deposition of the second conductive layer 492, an etching process may be performed to remove excess dielectric material from the second layer 120 (see block 332) and, further, a seed layer for the conductive layer may first be deposited (see block 334). After formation of the conductive material layer 492, a planarization process is performed to remove the excess conductive material in order to expose the conductive elements 129 (see block 350). This structure is illustrated in FIG. 4M, wherein the second conductive layer 492 has been substantially removed to expose the conductive elements 129, each conductive element 129 comprising a trench 128 that has been filled with the conductive material. The structure shown in FIG. 4M is the same as the embodiment of the substrate 100*b* shown in FIG. 11B.

Figure 4N:
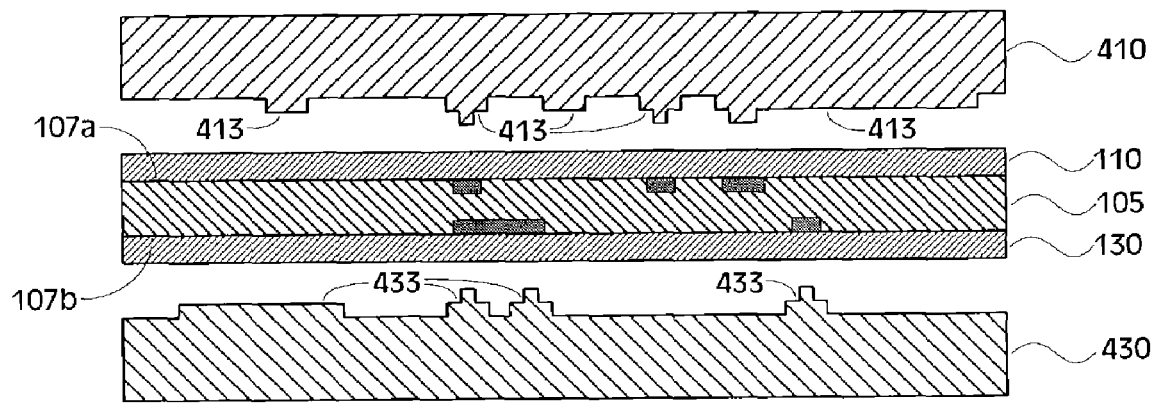
FIGS. 4N-4Q illustrate a substrate and circuitry that may be formed according to a further embodiment of the method of forming circuitry of FIG. 3.

As noted above, layers including circuitry may be formed on both of the opposing sides 107a, 107b of the base layer 105 (see FIGS. 1C and 1D). Formation of these structures is illustrated in FIGS. 4N through 4Q. Referring to FIG. 4N, a first ultrasonic tool 410 includes a series of protrusions 413, and another ultrasonic tool 430 includes a series of protrusions 433. The ultrasonic tool 410 will be used to create a trench pattern in a first layer of dielectric material 110 overlying one side 107a of base layer 105, whereas the ultrasonic tool 430 will be used to create a trench pattern in another layer of dielectric material 130 overlying the opposing side 107b of base layer 105. Note that, for the embodiment of FIGS. 4N-4Q, each of the ultrasonic tools (or tool foils) 410, 430 may be coupled with separate source of ultrasonic energy (i.e., this embodiment may require two separate ultrasonic vibrations machines).

Figure 4O:
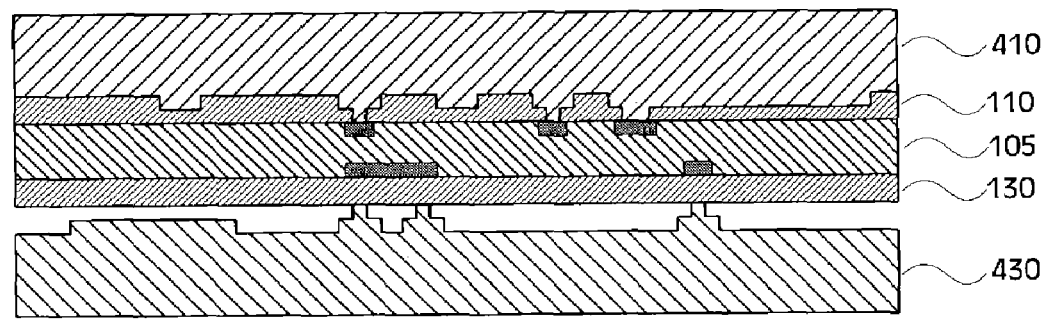

Referring to FIG. 4O, the ultrasonic tool 410 is applied to the first dielectric layer 110 to create the circuit pattern, as described above (see block 330). Note that, as shown in FIG. 4O, the ultrasonic tool 430 has been placed in contact with the dielectric layer 130 on the opposing side of base layer 105 to provide mechanical support for the base layer 105 while the first tool 410 is energized. The tool 430 is not, however, energized and vibrating while the first tool 410 is energized. Rather, the tools 410, 430 are energized sequentially.

Figure 4P:
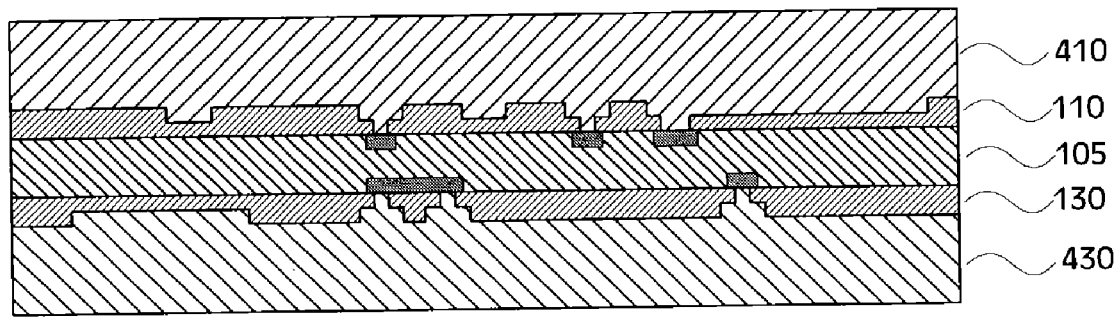

Turning to FIG. 4P, the other ultrasonic tool 430 has been energized and applied to the dielectric layer 130 on the opposing side of the base layer 105. The first tool 410 remains in engagement with the dielectric layer 10; however, the tool 410 has been de-energized and is no longer vibrating. Thus, the tool 410 provides mechanical support for the base layer 105 during trench formation in dielectric layer 130.

Figure 4Q:
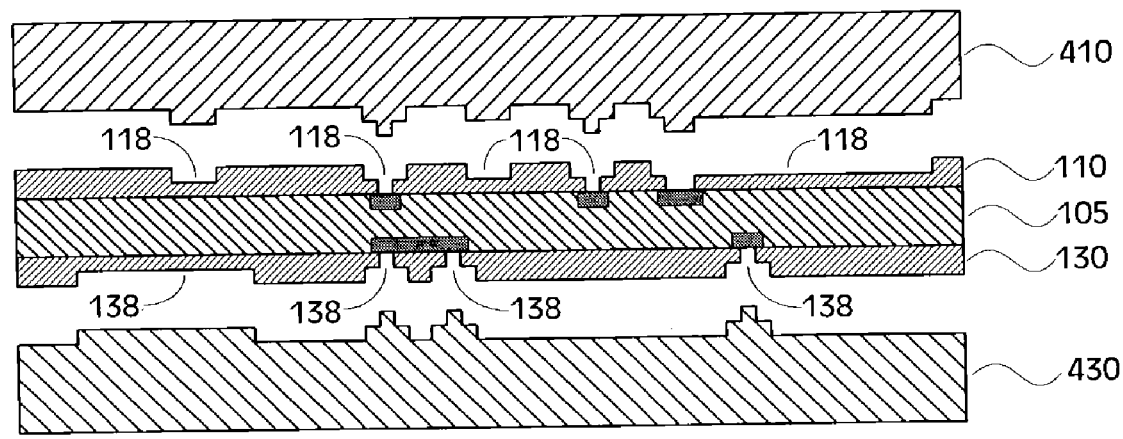

Referring next to FIG. 4Q, each of the ultrasonic tools 410, 430 has been removed. A set of trenches 118 has been formed in dielectric layer 110, and a set of trenches 138 has been formed in the dielectric layer 130, each set of trenches 118, 138 comprising a trench pattern corresponding to a desired circuit pattern. Conductive material deposition (see block 340) and planarization (see block 350) may then be performed on each side of the structure of FIG. 4Q to create the circuit patterns, wherein the resulting substrate would be the substrate 100c of FIG. 1C. Additional layers may then be added to each side of the substrate in a similar fashion, thereby forming the substrate 100d of FIG. 1D. It should be understood that FIGS. 1A through 1D present but a few examples of multi-layer substrates that may be created using ultrasonic vibrations according to the disclosed embodiments and, further, that such a substrate may include any suitable number of layers.

Figure 7:
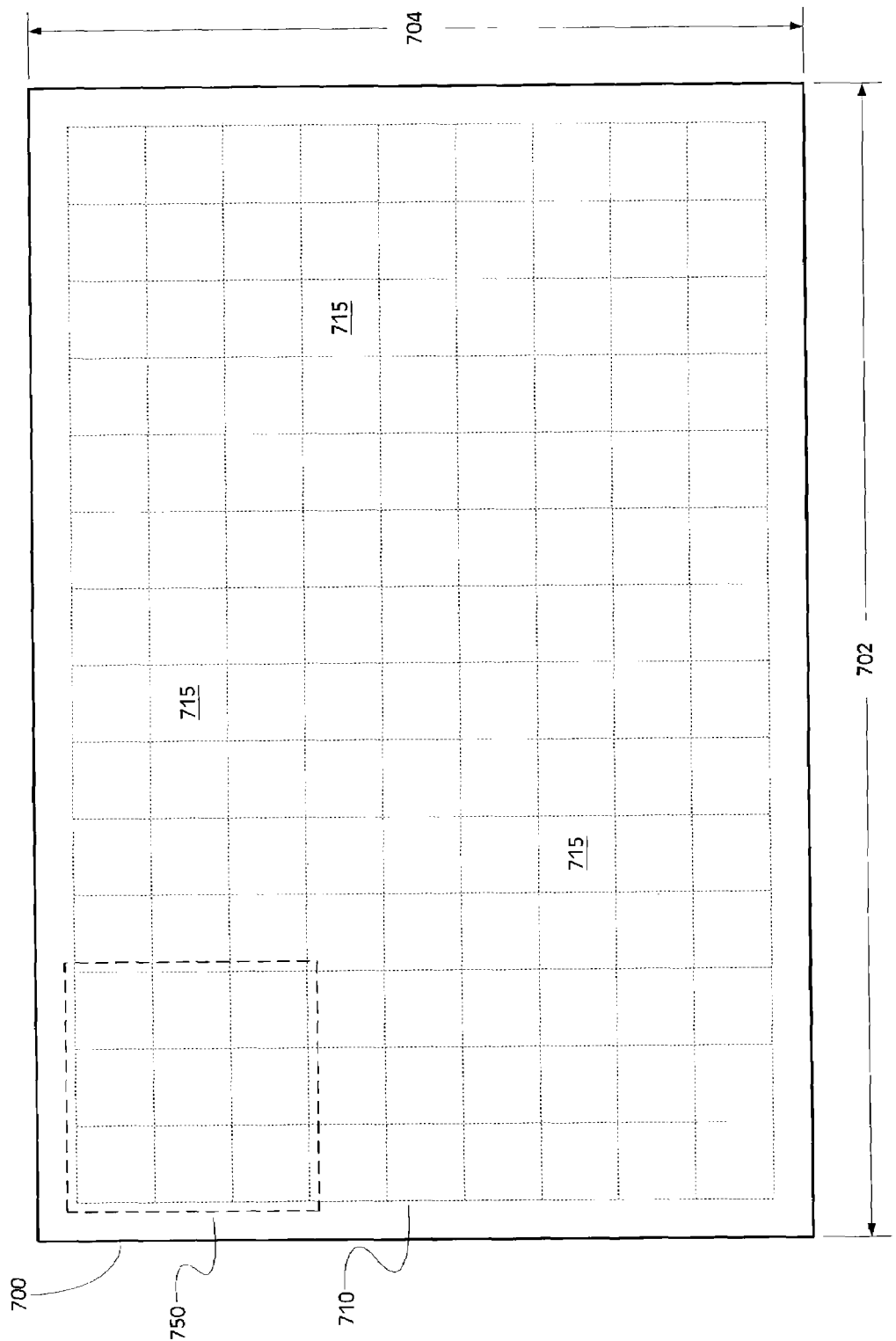
FIG. 7 shows a plan view of one embodiment of a board upon which a number of substrates may be formed using ultrasonic vibrations.

The above-described embodiments of the method of forming circuitry using ultrasonic vibrations were described in the context of creating a single substrate (e.g., a single package substrate). In a manufacturing environment, it may be desirable to create multiple substrates during the fabrication process. For example, in one embodiment, multiple substrates can be fabricated from a board of base layer material from which a number of individual substrates can be cut. Such a board is illustrated in FIG. 7. The board 700 of FIG. 7 has a length 702 and width 704 that are sized to provide an area sufficient to provide an array 710 of individual substrates 715. In one embodiment, the board 700 comprises an industry standard panel having a length equal to 510 mm and a width equal to 340 mm. Such a 510 mm by 340 mm panel may accommodate a 14×9 array of square substrates (as shown in FIG. 7), each substrate measuring approximately 35 mm on a side (or other array of substrates of any desired shape and size).

Figure 8:
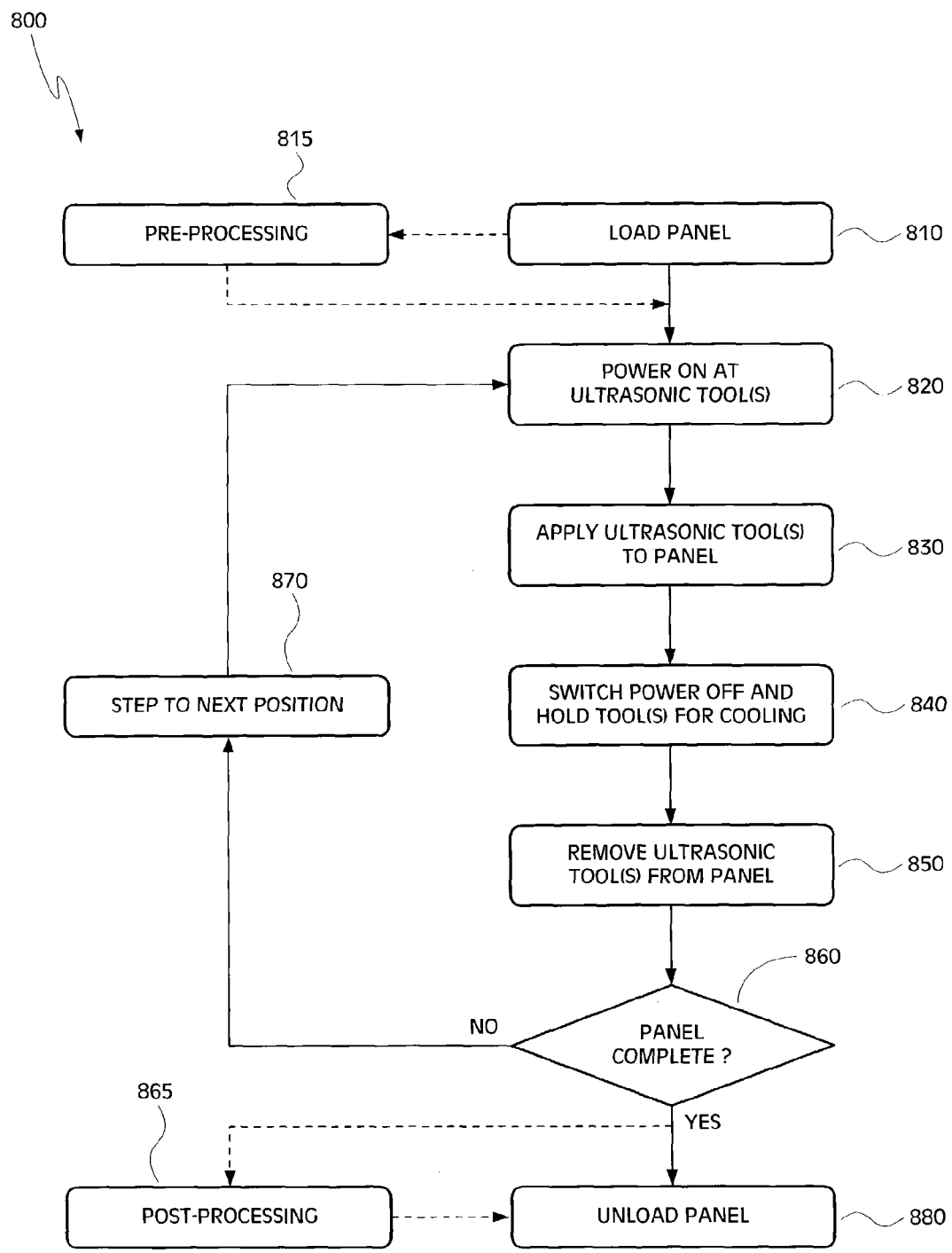
FIG. 8 is a block diagram illustrating another embodiment of a method of forming circuitry using ultrasonic vibrations.

An embodiment of a method 800 of fabricating circuit patterns on a relatively large panel (e.g., the board 700 of FIG. 7) is illustrated in FIG. 8. In one embodiment, the panel comprises a panel of base layer material upon which a layer of dielectric material has been disposed (on either one of or both of the opposing sides of the panel). In another embodiment, the panel is comprised of the base layer material, and a layer of dielectric material is secured to one side (or each side) of the panel. As previously noted, for thermosetting materials, the dielectric layer may be secured to the base layer using a lamination process, and for thermoplastic materials, the dielectric layer may be secured to the base layer using an adhesive or a thermobonding process.

Referring to block 810 in FIG. 8, the panel is loaded (e.g., into a chuck or other holding device). As shown at block 820, the ultrasonic tool (or tools, where circuitry is being formed on both sides of the panel) is powered on. The ultrasonic tool (or tools) is then applied to the panel to form a circuit pattern, as shown at block 830. It should be noted that the face of the ultrasonic tool may be placed in contact with the dielectric layer prior to applying power to the ultrasonic tool.

In one embodiment, a trench pattern for a single substrate is formed during one operation. However, in another embodiment, the ultrasonic tool includes multiple sets of raised features, each set for producing a trench pattern on one substrate, and multiple trench patterns may be formed during one operation. For example, a tool foil may include an array of trench patterns designed to simultaneously imprint the trench patterns on a subarray 750 of substrates, as shown in FIG. 7.

Referring now to block 840, power at the ultrasonic tool is switched off, and the tool is held against the panel for cooling (see FIG. 6, period 693). After sufficient cooling has occurred, the ultrasonic tool is removed from the panel, as shown at block 850. If circuit formation is not complete for all substrates on the panel—see block 860—the panel is, in one embodiment, stepped to the next position relative to the ultrasonic tool, as illustrated at block 870. In an alternative embodiment, the panel is held stationary, and the ultrasonic tool is stepped relative to the panel. The panel may be stepped to the next substrate or, alternatively, where the foil includes multiple circuit patterns, the panel may be stepped to the next subarray of substrates (see FIG. 7, item 750). Referring again to block 860, if circuit formation on the panel is complete, the panel may be unloaded, as shown at block 880.

In an alternative embodiment, prior to powering up and application of the ultrasonic tool, pre-processing 815 is performed, as shown at block 815. Where the panel comprises a layer of base material, pre-processing may include securing a layer of dielectric material on one of, or both of, the opposing sides of the panel (see FIG. 3, block 320). A thermosetting material layer may be secured to the base layer using a lamination process, and a thermoplastic material layer may be secured to the base layer using an adhesive or a thermobonding process, all as noted above. Pre-processing may also include drying of the dielectric material to remove moisture. In another alternative embodiment, post-processing 865 is performed after trench formation on the panel is complete. Post-processing may include deposition of a conductive layer, planarization, etching, and deposition of a seed layer for the conductive layer (see FIG. 3, blocks 340, 350, 332, 334).

The method 800 of FIG. 8 may be followed to build up any desired number of layers and circuitry on the panel. For each layer, the above-described process (i.e., blocks 820 through 870, as well as block 815 and/or block 865) are repeated, as previously described.

Illustrated in FIG. 9 is an embodiment of an apparatus 900 for providing ultrasonic vibrations. The apparatus 900 of FIG. 9 presents one example of a source of ultrasonic mechanical energy that may be used to form circuitry according to the embodiments disclosed herein. However, the apparatus of FIG. 9 is presented here without limitation, and it should be understood that any suitable ultrasonic vibration apparatus may be employed to practice the disclosed embodiments.

Referring to FIG. 9, the ultrasonic apparatus 900 includes a "horn stack" 910 that is coupled with a power supply 920. The power supply 920 provides an ultrasonic signal 925 to the horn stack 910, and the horn stack (or other suitable device) converts this electrical signal to a mechanical vibration of an appropriate amplitude. The signal provided by power supply 920 may have a frequency of between 15 kHz and 70 kHz and, in one embodiment, the frequency is in the range of 20 kHz to 40 kHz. Coupled with the horn stack 910 is an ultrasonic tool foil 918 (e.g., tool 410, 420, or 430, as shown in FIGS. 4A-4Q and FIG. 5). The mechanical vibration of the horn stack 910 is transferred to the tool foil 918, which vibrates in a vertical direction relative to a workpiece 905 (see arrow 901).

Workpiece 905 may comprise an individual substrate upon which one or more layers having circuitry are to be formed (see FIGS. 1A-1D), or a panel from which multiple substrates may be cut (see FIG. 7). The workpiece 905 is loaded into and rigidly held in place by a holding device 930 (e.g., a chuck or similar device). To lower the horn stack 910 and attached tool foil 918 towards the workpiece 905, such that the foil 918 can be plunged into the workpiece 905, the apparatus 900 includes a tool positioning system 940. Tool positioning system 940 provides movement of the horn stack 910 in a direction 902 that is parallel to the direction of vibration 901 of the horn stack. In one embodiment, under control of positioning system 940, the pressure exerted by the horn stack 910 on the workpiece 905 during circuit formation may be in the range of 20 to 100 psi (pounds per square inch), which is relatively low in comparison to the pressure used in compression molding or cold forming (e.g., up to 1100 psi).

Coupled with the holding device 930 is a motion system 950. The motion system 950 is capable of moving the workpiece 905 relative to the horn stack 910. In one embodiment, the motion system 950 comprises a mechanism (e.g., a roller or conveyor) providing movement in one-dimension in a plane perpendicular to the direction of motion of the horn stack 910 (see arrow 903). In another embodiment, the motion system 950 comprises a two-dimensional motion system, again providing movement in the plane perpendicular to the horn stack 910. In a further embodiment, motion system 950 comprises a three-dimensional motion system that, in addition to providing two-dimensional motion in the perpendicular plane, also provides movement in a direction parallel to the horn stack 910 (i.e., parallel to the vibration of the horn stack, as indicated by arrow 901). For this latter embodiment, the tool positioning system 940 may not be necessary.

In one embodiment, as shown in FIG. 9, the horn stack 910 comprises a converter 912, a booster 914, and a horn 916. The converter 912 converts the ultrasonic signal 925 received from power supply 920 into mechanical motion at an ultrasonic frequency. The booster 914 is coupled with the converter 912, and the booster 914 amplifies the amplitude of the mechanical vibration provided by converter 912. The horn 916 is coupled with the booster 914, and the horn 916 is also coupled with the tool foil 918. The horn 916 is an acoustic device that transfers the vibratory energy to the tool foil 918 and, hence, to the workpiece 905 for imprinting. The amplitude of vibration provided by the horn stack 910 at foil 918 may range from 0.2 μm to 70 μm and, in one embodiment, this amplitude ranges from 5 μm to 10 μm.

Embodiments of methods 300, 800 for forming circuitry using ultrasonic vibrations, as well as various embodiments of a substrate including circuitry formed using ultrasonic energy, having been herein described, those of ordinary skill in the art will appreciate the advantages of the disclosed embodiments. Using ultrasonic vibrations according to the embodiments disclosed above enables the creation of highly dense circuit patterns having small feature sizes under relatively low pressures and at room temperature. The combination of low temperature and pressure minimizes damage to previously formed underlying layers and also reduces the potential for material degradation (e.g., thermally induced degradation). Further, the ultrasonic imprinting operation is relatively fast—the imprinting operation taking from 0.5 to 10 seconds—and is, therefore, very efficient from a manufacturing standpoint.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   disposing a first layer of a first material on a surface of a base layer;
   vibrating a tool at an ultrasonic frequency, the tool including a trench pattern; and
   applying the vibrating tool to the first layer to form the trench pattern in the first layer, wherein applying the vibrating tool to the first layer comprises plunging the vibrating tool into the first layer to a desired depth.

2. The method of claim 1, further comprising:
   depositing a layer of a conductive material over a surface of the first layer and surfaces of the trench pattern; and
   removing the conductive material from at least a portion of the surface of the first layer.

3. The method of claim 2, wherein the conductive material is removed using one of a planarization process and an etching process.

4. The method of claim 2, further comprising:
   prior to depositing the conductive material layer, etching the first layer to remove excess first material from the trench pattern.

5. The method of claim 4, wherein the base layer includes a conductor underlying the trench pattern, the method further comprising exposing the conductor by the etching of the first layer.

6. The method of claim 2, further comprising:
   prior to depositing the conductive material layer, depositing a seed layer for the conductive material over the surface of the first layer.

7. The method of claim 2, further comprising:
disposing a second layer of a second material over the surface of the first layer and the conductive material remaining in the trench pattern;
vibrating a second tool at an ultrasonic frequency, the second tool including a second trench pattern; and
applying the vibrating second tool to the second layer to form the second trench pattern in the second layer.

8. The method of claim 7, further comprising:
depositing a second layer of conductive material over a surface of the second layer and surfaces of the second trench pattern; and
removing the conductive material from at least a portion of the surface of the second layer.

9. The method of claim 7, wherein the first material is the same as the second material.

10. The method of claim 7, wherein each of the first and second materials comprises a dielectric material.

11. The method of claim 1, wherein the base layer comprises one of a circuit board material, a ceramic material, a semiconductor material, and a polymer material.

12. The method of claim 1, wherein the trench pattern comprises a number of protrusions extending from a face of the tool.

13. The method of claim 1, wherein the trench pattern comprises a number of trenches and at least some of the trenches have a dimension less than approximately 30 μm.

14. A method comprising:
disposing a first layer of a first material on a surface of a base layer;
vibrating a tool at an ultrasonic frequency, the tool including a trench pattern; and
applying the vibrating tool to the first layer to form the trench pattern in the first layer, wherein each of the first and second materials comprises one of a thermoplastic material and a thermosetting material.

15. The method of claim 14, further comprising:
disposing a second layer of a second material over an opposing surface of the base layer;
vibrating a second tool at an ultrasonic frequency, the second tool including a second trench pattern; and
applying the vibrating second tool to the second layer to form the second trench pattern in the second layer.

16. The method of claim 15, further comprising:
depositing a second layer of conductive material over a surface of the second layer and surfaces of the second trench pattern; and
removing the conductive material from at least a portion of the surface of the second layer.

17. The method of claim 15, wherein the first material is the same as the second material.

18. The method of claim 15, wherein each of the first and second materials comprises a dielectric material.

19. The method of claim 18, wherein each of the first and second materials comprises one of a thermoplastic material and a thermosetting material.

20. The method of claim 14, wherein the ultrasonic frequency comprises a frequency in a range up to approximately 70 kHz.

21. The method of claim 14, wherein the vibrations of the tool raise a temperature of the first layer in a region surrounding a face of the tool to approximately a glass transition temperature of the first material.

22. The method of claim 21, wherein the vibrations of the tool raise a temperature of the first layer in a region surrounding a face of the tool to approximately a melt temperature of the first material.

23. A method comprising:
vibrating a tool at an ultrasonic frequency, the tool including a trench pattern; and
applying the vibrating tool to a layer of dielectric material to form the trench pattern in the dielectric layer, the dielectric layer overlying a base layer, wherein applying the vibrating tool to the layer of dielectric material comprises plunging the vibrating tool into the layer of dielectric material to a desired depth.

24. The method of claim 23, further comprising:
depositing a layer of a conductive material over a surface of the dielectric layer and surfaces of the trench pattern; and
removing the conductive material from at least a portion of the surface of the dielectric layer.

25. The method of claim 24, wherein the conductive material is removed using one of a planarization process and an etching process.

26. The method of claim 24, further comprising:
prior to depositing the conductive material layer, etching the first layer to remove excess first material from the trench pattern.

27. The method of claim 26, wherein the base layer includes a conductor underlying the trench pattern, the method further comprising exposing the conductor by the etching of the first layer.

28. The method of claim 24, further comprising:
prior to depositing the conductive material layer, depositing a seed layer for the conductive material over the surface of the first layer.

29. The method of claim 23, wherein the base layer comprises one of a circuit board material, a ceramic material, a semiconductor material, and a polymer material.

30. The method of claim 23, wherein the trench pattern comprises a number of protrusions extending from a face of the tool.

31. The method of claim 23, wherein the trench pattern comprises a number of trenches and at least some of the trenches have a dimension less than approximately 30 μm.

32. A method comprising:
vibrating a tool at an ultrasonic frequency, the tool including a trench pattern; and
applying the vibrating tool to a layer of dielectric material to form the trench pattern in the dielectric layer, the dielectric layer overlying a base layer, wherein the dielectric material comprises one of a thermoplastic material and a thermosetting material.

33. The method of claim 32, wherein the ultrasonic frequency comprises a frequency in a range up to approximately 70 kHz.

34. A method comprising:
loading a panel into a holding device, the panel including a base layer and a layer of dielectric material;
positioning the panel at a first location relative to a tool, the tool having a trench pattern;
vibrating the tool at an ultrasonic frequency; and
applying the vibrating tool to the dielectric material layer to form the trench pattern in the dielectric material layer.

35. The method of claim 34, further comprising:
halting vibration of the tool; and
holding the tool against the panel to allow the dielectric material layer to cool.

36. The method of claim 34, further comprising:
positioning the panel at a second location relative to the tool;
vibrating the tool at the ultrasonic frequency; and applying the vibrating tool to the dielectric material layer to form the trench pattern in the dielectric material layer.

37. The method of claim 34, wherein the panel has a length of approximately 510 mm and a width of approximately 340 mm.

38. The method of claim 34, wherein the tool includes an array of trench patterns.

39. The method of claim 34, wherein the panel comprises the base layer, the method further comprising:
disposing the layer of dielectric material over the surface of the base layer.

40. The method of claim 34, further comprising:
depositing a layer of a conductive material over a surface of the dielectric material layer and surfaces of the trench pattern; and
removing the conductive material from at least a portion of the surface of the dielectric material layer.

41. The method of claim 40, wherein the conductive material is removed using one of a planarization process and an etching process.

42. The method of claim 40, further comprising:
prior to depositing the conductive material layer, etching the dielectric material layer to remove excess dielectric material from the trench pattern.

43. The method of claim 42, wherein the base layer includes a conductor underlying the trench pattern, the method further comprising exposing the conductor by the etching of the dielectric layer.

44. The method of claim 40, further comprising:
prior to depositing the conductive material layer, depositing a seed layer for the conductive material over the surface of the dielectric material layer.

45. The method of claim 34, further comprising unloading the panel from the holding device.

46. The method of claim 34, wherein the ultrasonic frequency comprises a frequency in a range up to approximately 70 kHz.

47. The method of claim 34, wherein the dielectric material comprises one of a thermoplastic material and a thermosetting material.

48. The method of claim 34, wherein the base layer comprises one of a circuit board material, a ceramic material, a semiconductor material, and a polymer material.

49. The method of claim 34, wherein the trench pattern comprises a number of protrusions extending from a face of the tool.

50. The method of claim 34, wherein the trench pattern comprises a number of trenches and at least some of the trenches have a dimension less than approximately 30 µm.

* * * * *